(12) United States Patent
Chen

(10) Patent No.: US 9,006,583 B2
(45) Date of Patent: Apr. 14, 2015

(54) LCD MODULE AND LIQUID CRYSTAL DISPLAY DEVICE

(75) Inventor: Yin-Hung Chen, Guandong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 292 days.

(21) Appl. No.: 13/521,742

(22) PCT Filed: May 17, 2012

(86) PCT No.: PCT/CN2012/075636
§ 371 (c)(1),
(2), (4) Date: Jul. 12, 2012

(87) PCT Pub. No.: WO2013/166742
PCT Pub. Date: Nov. 14, 2013

(65) Prior Publication Data
US 2013/0300959 A1    Nov. 14, 2013

(51) Int. Cl.
*H05K 1/16* (2006.01)
*G02F 1/1345* (2006.01)
*H05K 1/14* (2006.01)
*H05K 1/02* (2006.01)

(52) U.S. Cl.
CPC ............... *G02F 1/1345* (2013.01); *H05K 1/14* (2013.01); *H05K 1/0215* (2013.01); *H05K 1/144* (2013.01)

(58) Field of Classification Search
CPC ... H05K 1/0277; H05K 1/0278; H05K 1/028; H05K 1/0283; H05K 1/11; H05K 1/14; H05K 1/141; H05K 1/142; H05K 1/147; H05K 1/145; H05K 1/148; H05K 1/18; H05K 1/181; H05K 1/188; H05K 1/189; H01R 9/09; H01R 23/68
USPC ......................... 174/260, 250, 254, 255, 261; 361/679.01, 679.02, 728, 736
See application file for complete search history.

(56) References Cited

U.S. PATENT DOCUMENTS

| | | |
|---|---|---|
| 2008/0106313 A1* | 5/2008 | Keady et al. .................. 327/179 |
| 2010/0110056 A1* | 5/2010 | Kim et al. ..................... 345/211 |

* cited by examiner

*Primary Examiner* — Tremesha S Willis
(74) *Attorney, Agent, or Firm* — Andrew C. Cheng

(57) ABSTRACT

A liquid crystal display module is disclosed and it includes a first printed circuit board, a second printed circuit board interconnected by a flat flexible cable, and a timing controller encapsulated within the flat flexible cable. The present invention further includes a liquid crystal display module incorporated with such module. The liquid crystal display module and device can incorporate with a second printed circuit board with reduced size, while the heat dissipating effect is increased, and the overall size of the flat flexible cable is reduced.

11 Claims, 8 Drawing Sheets

LCD MODULE AND LIQUID CRYSTAL DISPLAY DEVICE

FIELD OF THE INVENTION

The present invention relates to a technical field of LCD displaying, and more particularly to a LCD module and a LCD device implementing the module.

BACKGROUND OF THE INVENTION

Because of the features of low radiation, compact and slim, and low energy exhaustion, the LCD panel has been widely implemented in the fields of mobile phone, personal digital assistance (PDA), notebook computer, and television etc.

In a LCD module, it generally includes a C-board and an X-board interconnected with flat flexible cable. The C-board is generally configured with a timing controller (TCON), and a power module. Since the TCON takes a majority surface area of the C-board, this is detrimental to the compactization of the C-band.

SUMMARY OF THE INVENTION

The invention is intended to address the compactization of the C-board in which a TCON is incorporated and which is the key issue hindered the compactization of the C-board.

In order to address the technical issues as discussed above, the present invention introduces a liquid crystal display module which includes a first printed circuit board, a second printed circuit board interconnected by a flat flexible cable, and a timing controller encapsulated within the flat flexible cable. The flexible flat cable includes a first trace layer, a first ground layer, a second trace layer, and a second ground layer. A front face of the first trace layer is attached to the rear face of the first ground layer. The front face of the first ground layer is attached to a front face of the timing controller, and a front face of the second ground layer is attached to the rear face of the timing controller. A rear face of the second ground layer is attached to a front face of the second trace layer. The front face of the timing controller includes an input, and an output interface embodied in golden fingers, a first power conductive pad, and a ground conductive pad. The input interface and output interface is located at opposite ends of the front face. The first power conductive pad and the ground conductive pad are arranged on the other opposite ends of the front face of the timing controller.

In one of the embodiment of the present invention, wherein a first insulative layer is patched on both upper and rear faces of the first ground layer, the front face of the first ground layer defining an opening, and a first front conductive layer which is exposed and uncovered from the first insulative layer, the first ground layer further including a first rear conductive layer which is exposed and uncovered by the first insulative layer, the first rear conductive layer extending along a longitudinal side of the first ground layer to opposite ends.

In order to address the technical issues as discussed above, the present invention introduces a liquid crystal display module which includes a liquid crystal display module which a first printed circuit board, a second printed circuit board interconnected by a flat flexible cable, and a timing controller encapsulated within the flat flexible cable.

In one of the embodiment of the present invention, wherein the flexible flat cable includes a first trace layer, a first ground layer, a second trace layer, and a second ground layer, a front face of the first trace layer being attached to the rear face of the first ground layer, the front face of the first ground layer being attached to a front face of the timing controller, a front face of the second ground layer being attached to the rear face of the timing controller, a rear face of the second ground layer being attached to a front face of the second trace layer.

In one of the embodiment of the present invention, wherein the front face of the timing controller includes an input, and an output interface embodied in golden fingers, a first power conductive pad, and a ground conductive pad, the input interface and output interface being located at opposite ends of the front face, the first power conductive pad and the ground conductive pad being arranged on the other opposite ends of the front face of the timing controller.

In one of the embodiment of the present invention, wherein the timing controller further includes a heat dissipating pad on the front face, the heat dissipating pad extends toward the first power conductive pad and has a preset gap arranged therebetween.

In one of the embodiment of the present invention, wherein a first insulative layer is patched on both upper and rear faces of the first ground layer, the front face of the first ground layer defining an opening, and a first front conductive layer which is exposed and uncovered from the first insulative layer, the first ground layer further including a first rear conductive layer which is exposed and uncovered by the first insulative layer, the first rear conductive layer extending along a longitudinal side of the first ground layer to opposite ends.

In one of the embodiment of the present invention, wherein the first trace layer includes a second insulative layer covering both the front and rear faces of the conductive layer, the front face of the first trace layer is defined with a second opening which penetrates the first trace layer, and a second front conductive layer which is exposed and uncovered by the second insulative layer, the first trace layer further includes a plurality of third golden fingers and second power conductive pad, the second front conductive layer extends to opposite ends along the front face of the first trace layer, third golden fingers are located between the second front conductive layer and the second power conductive pad, a gap between the input interface and output interface on the front face of the timing controller equals to the width and gap of the third golden fingers.

In one of the embodiment of the present invention, wherein the rear face of the first trace layer includes a fourth golden fingers which are located at opposite edges of the rear face of the first trace layer.

In one of the embodiment of the present invention, wherein the first and second trace layers and have the identical configuration, and the first and second ground layers are identical, and the timing controller has an identical configuration on its upper and rear faces.

In one of the embodiment of the present invention, wherein the first printed circuit board and the second printed circuit board are each provided with an electrical connector and the first printed circuit board and the second printed circuit board are interconnected by the flat flexible cable terminated to the connectors, each connector featuring a mating interface having contact engaging portion and a mounting interface having pin legs, the fourth golden fingers of the first and second trace layers are electrically interconnected with the connectors.

In order to address the technical issues as discussed above, the present invention introduces a liquid crystal display device which includes a liquid crystal module configured with a liquid crystal display module which a first printed circuit board, a second printed circuit board interconnected by a flat flexible cable, and a timing controller encapsulated within the flat flexible cable.

In one of the embodiment of the present invention, wherein the flexible flat cable includes a first trace layer, a first ground layer, a second trace layer, and a second ground layer, a front face of the first trace layer being attached to the rear face of the first ground layer, the front face of the first ground layer being attached to a front face of the timing controller, a front face of the second ground layer being attached to the rear face of the timing controller, a rear face of the second ground layer being attached to a front face of the second trace layer.

In one of the embodiment of the present invention, wherein the front face of the timing controller includes an input, and an output interface embodied in golden fingers, a first power conductive pad, and a ground conductive pad, the input interface and output interface being located at opposite ends of the front face, the first power conductive pad and the ground conductive pad being arranged on the other opposite ends of the front face of the timing controller.

The present invention can be concluded with the following advantages. As compared to the prior arts, the timing controller is relocated out of the second printed circuit board of the liquid crystal display module and device, and properly integrated within the flat flexible cable. As a result, the over dimension of the second printed circuit board can be largely reduced. In addition, the front and rear faces of the timing controller is provided with an enlarged heat dissipating pad which benefits the heat dissipation efficiency of both the first and second ground layers. In addition, the front and rear faces of the laminated flat flexible cable is provided with the fourth golden fingers. Accordingly, the overall size of the flat flexible cable can be largely reduced with the same pin counts. Typically, it can reduce to a size of one half of original dimension.

DETAILED DESCRIPTION OF PREFERRED EMBODIMENTS

A detailed and concise description with respect to each of the following embodiments will be given along with the accompanied drawings. Apparently and it should be noted that the embodiments disclosed hereinafter are merely typical and illustrated one, while should not be construed as whole. It is therefore any alternatives and modifications by the skilled in the art in view of those embodiments should be covered by the appended claims.

Figure 1:
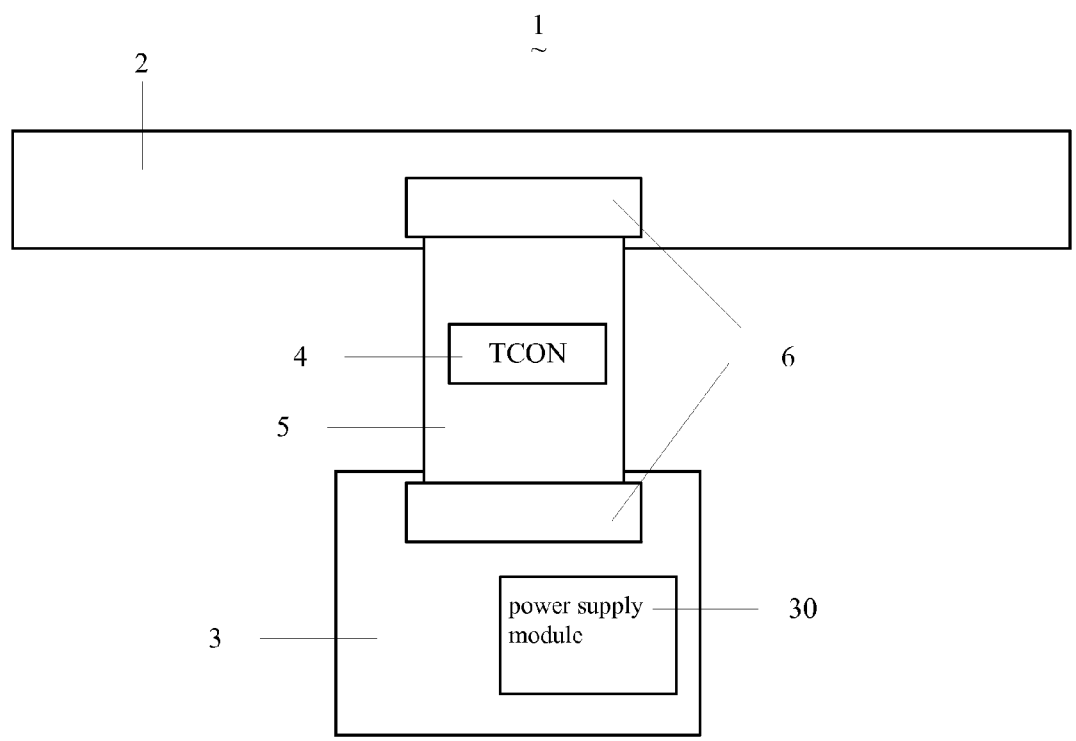
FIG. 1 is an illustrational and structural view of a liquid crystal display module made in accordance with a preferred embodiment of the present invention.
Figure 2:
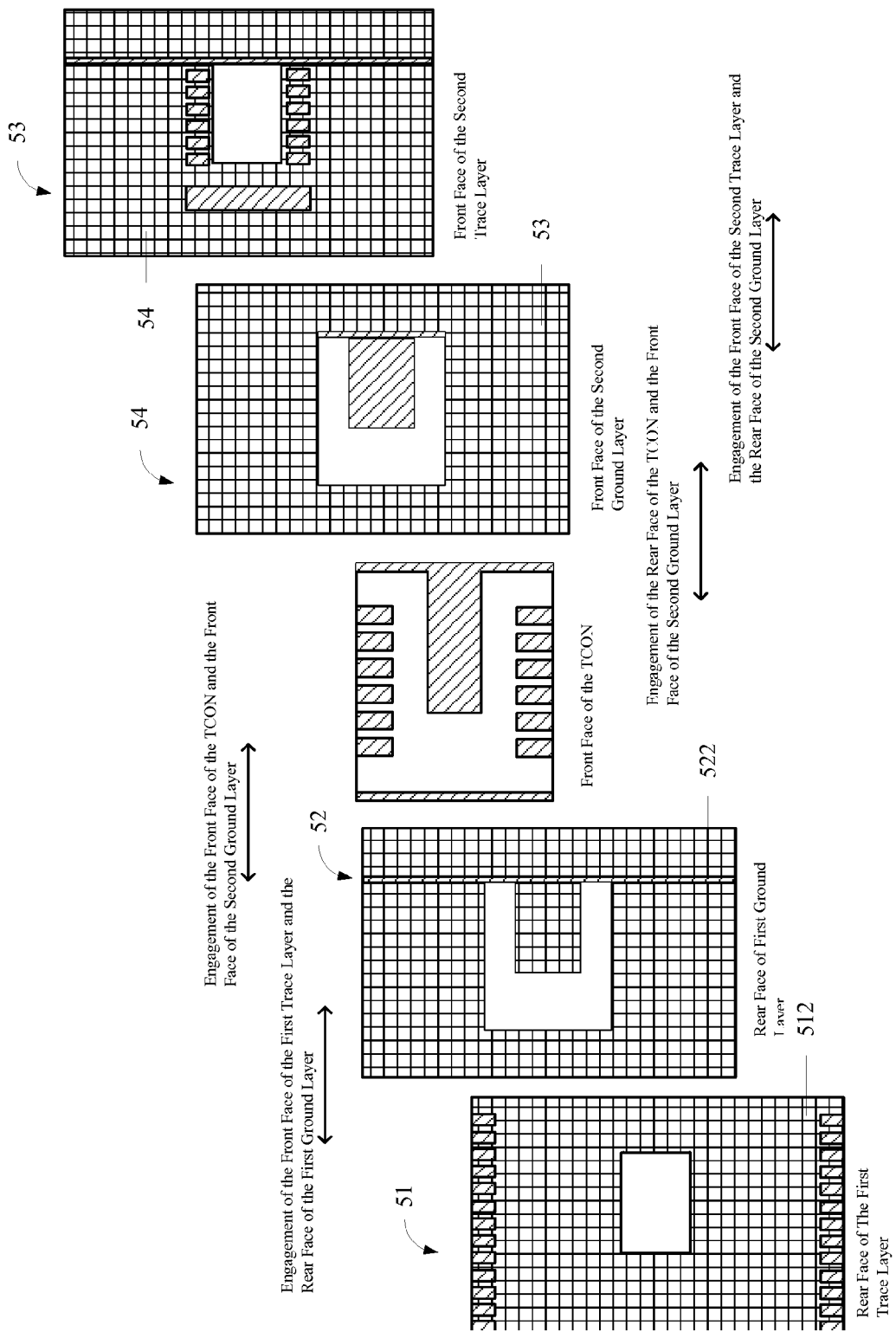
FIG. 2 is an exploded view of a flat flexible cable incorporated within the module shown in FIG. 1.

As shown in FIG. 1, the present invention discloses a liquid crystal display module 1, and which includes a first printed circuit board 2, a second printed circuit board 3, and a timing controller 4. The first and second printed circuit boards 2 and 3 are interconnected via a flat flexible cable 5. The timing controller 4 is disposed on the flat flexible cable 5. Accordingly, the timing controller 4 and the flat flexible cable 5 are integral together.

The first printed circuit board 2 is the X-board within the liquid crystal display module 1, while the second printed circuit board 3 is the C-board of the module 1. The first printed circuit board 2 and the second printed circuit board 3 are each provided with an electrical connector 6. The connectors each is provided with contact engaging portions and pin legs (not shown in the drawings) on the mating interface and mounting interface respectively. The first printed circuit board 2 and the second printed circuit board 3 are interconnected by the flat flexible cable 5 terminated to the connectors 6. The second printed circuit board 3 further includes a power module 30.

Referring now to FIG. 2 through 7, the flat flexible cable 5 is configured with multiple layers so as to configure a bus line. The flat flexible cable 5 can be embodied as a flexible printed circuit (FPC) flexible flat cable (FFC). The flexible flat cable is generally configured with a plurality of flattened conductor laminated with upper and lower insulators. The flexible flat cable 5 made in accordance with the present invention generally includes a first trace layer 51, a first ground layer 52, a second trace layer 53, and a second ground layer 54. A front face 510 of the first trace layer 51 is attached to the rear face 522 of the first ground layer 52. The front face of the first ground layer 52 is attached to a front face 40 of the timing controller 4. A front face 540 of the second ground layer 54 is attached to the rear face of the timing controller 4. A rear face of the second ground layer 54 is attached to a front face 530 of the second trace layer 53.

The first and second trace layers 51 and 53 have the identical configuration, and the first and second ground layers 52 and 54 are identical. The timing controller 4 has an identical configuration on its upper and rear faces.

Figure 3:
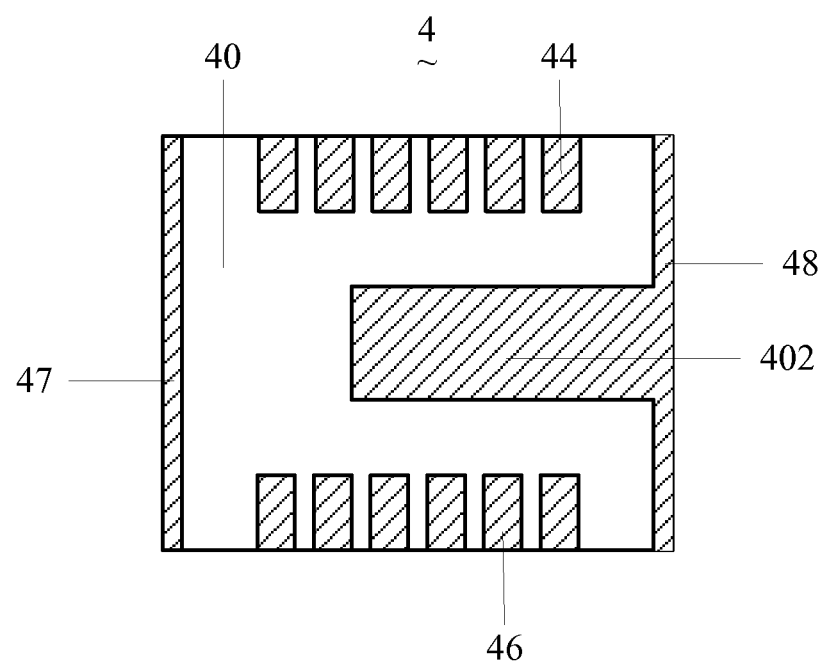
FIG. 3 is an enlarged view of a front face configuration of a timing controller shown in FIG. 2.

Referring to FIG. 3, the timing controller 4 is embodied as an IC chip, and the front face 40 of the timing controller 4 includes an input interface 44 (a plurality of golden fingers), and an output interface 46 (a plurality of golden fingers), a first power conductive pad 47, and a ground conductive pad 48. The input interface 44 and output interface 46 are located at opposite ends of the front face 40. The first power conductive pad 47 and the ground conductive pad 48 are arranged on the other opposite ends of the front face 40 of the timing controller 4. In this embodiment, the timing controller 4 is embodied as a rectangular configuration.

The timing controller 4 further includes a heat dissipating pad 402 on the front face 40. The heat dissipating pad 402 and the ground conductive pad 48 are integral together. The heat dissipating pad 402 and the ground conductive pad 48 extends toward the first power conductive pad 47, but is isolated from the first power conductive pad 47. A preset gap is arranged therebetween.

Figure 4:
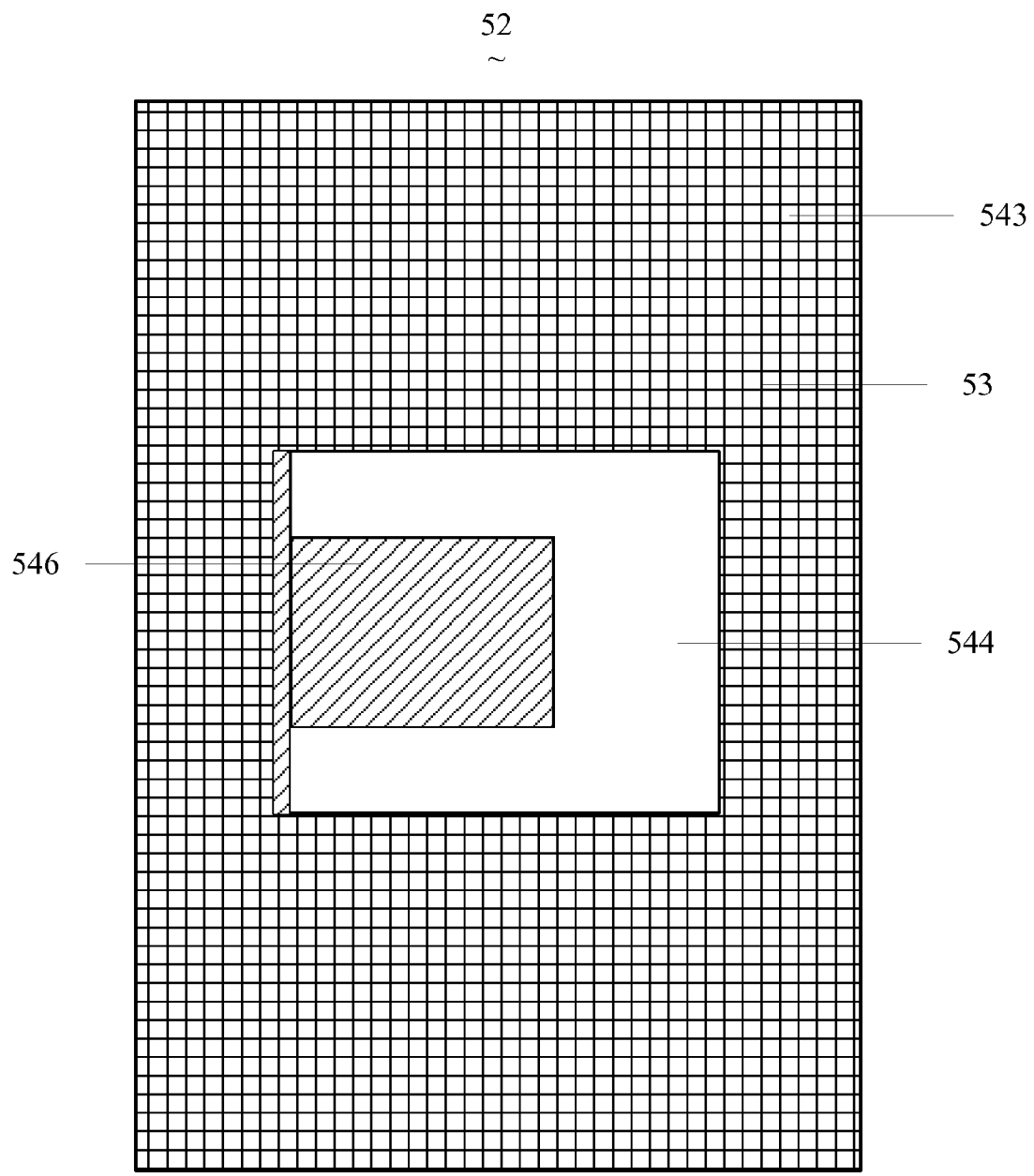
FIG. 4 is an enlarged view of a front face configuration of a first ground layer shown in FIG. 2.

Referring to FIG. 4, the first ground layer 54 includes a conductive layer (not shown), and a first insulative layer 543 patched on both upper and rear faces of the first ground layer 54. The conductive layer is a sheet of copper foil, and the first insulative layer 543 can be made from all kind of suitable insulative material. The front face 540 of the first ground layer 54 defines an opening 544, and a first front conductive layer 546 which is exposed from the first insulative layer 543. The first front conductive layer 546 is located adjacent to the opening 544.

Figure 5:
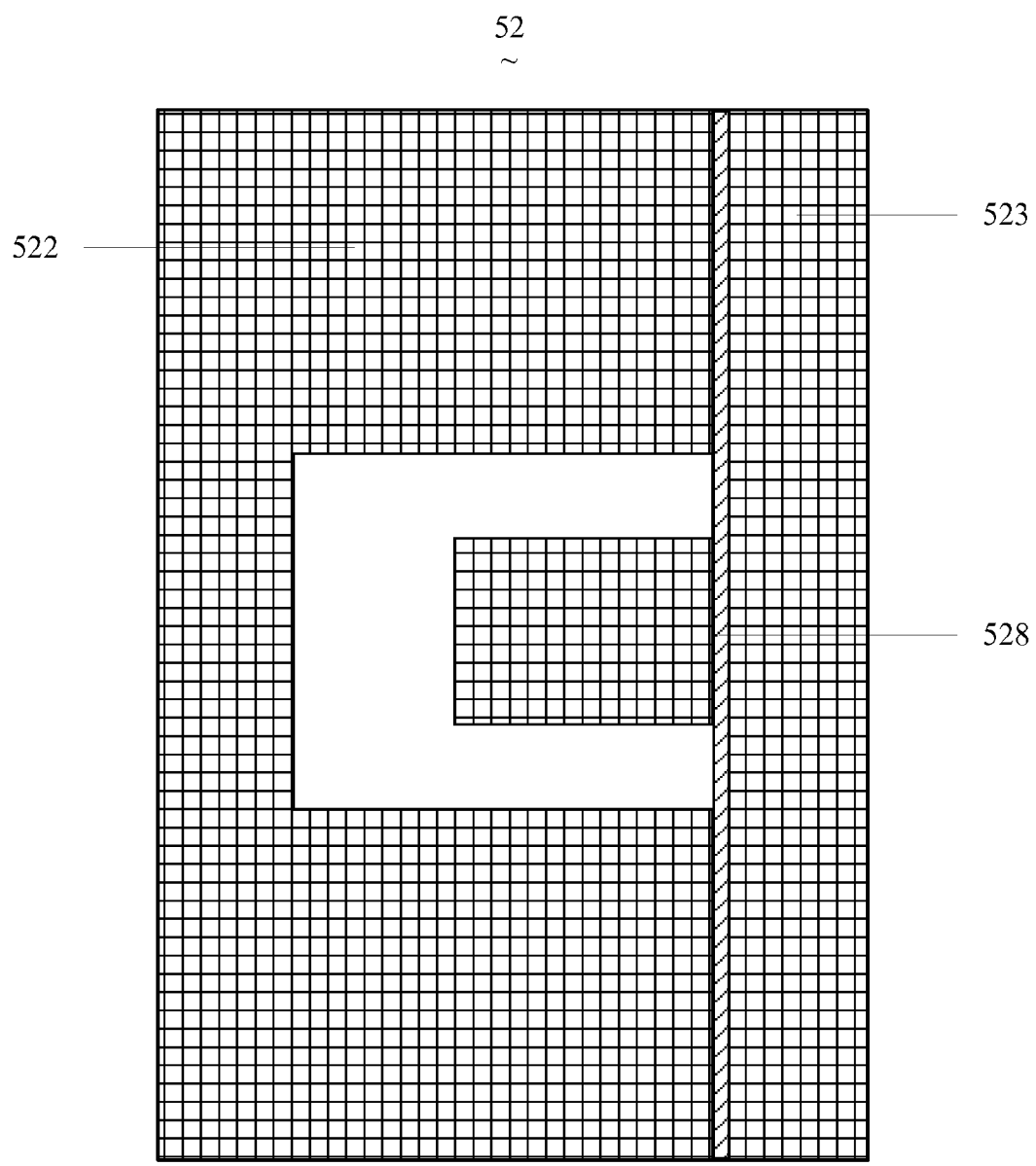
FIG. 5 is an enlarged view of a rear face configuration of a first ground layer shown in FIG. 2.

Referring to FIG. 5, the first ground layer 52 further includes a first rear conductive layer 528 which is exposed and uncovered by the first insulative layer 523. The first rear conductive layer 528 has an elongate configuration, and extends along a longitudinal side of the first ground layer 52 to opposite ends.

Figure 6:
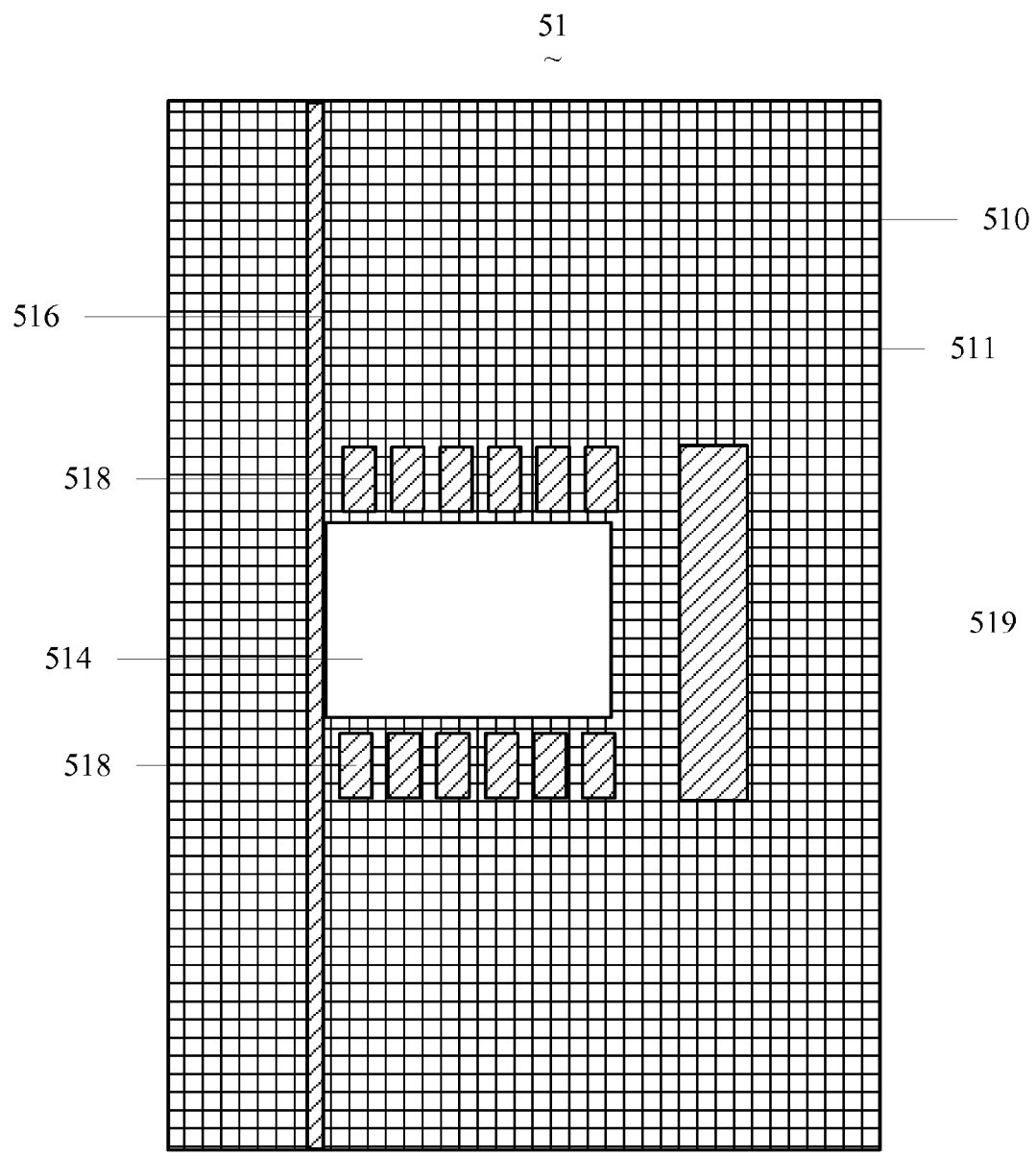
FIG. 6 is an enlarged view of a front face configuration of the first trace layer shown in FIG. 2.

Referring to FIG. 6, the first trace layer 51 includes a conductive layer (not shown), and a second insulative layer 511 which covers both the front and rear faces of the conductive layer. The conductive layer is configured by a plurality of copper strips which are arranged in parallel to each other. The front face 510 of the first trace layer 51 is defined with a second opening 514 which penetrates the first trace layer 51, and a second front conductive layer 516 which is exposed and uncovered by the second insulative layer 511. The first trace layer 51 further includes a plurality of third golden fingers 518 and second power conductive pad 519. The plurality of third golden fingers 518 are located between the second front conductive layer 516 and the second power conductive pad 519. The third golden fingers 518 are corresponding to the input golden finger 44 and the output golden finger 46 of the timing controller 4.

Figure 7:
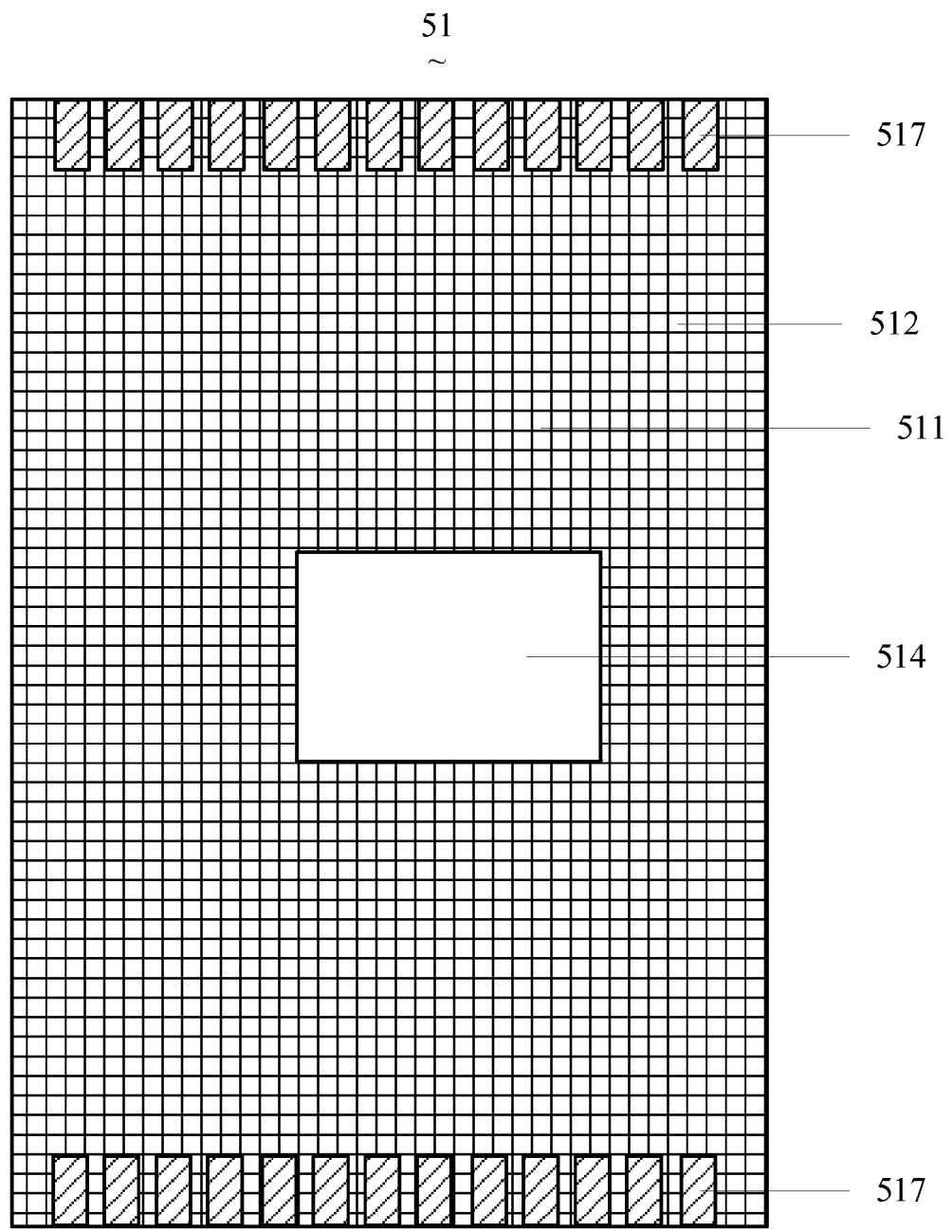
FIG. 7 is an enlarged view of a rear face configuration of the first trace layer shown in FIG. 2.

Please referring to FIG. 7, the rear face 512 of the first trace layer 51 includes a fourth golden fingers 517 which are located at opposite edges of the rear face 512 of the first trace layer 51. The fourth golden fingers 517 are formed by exposing the conductive strips covered by the second insulative layer 511.

In order to avoid poor electrical contacts, the timing controller 4, the first trace layer 51, the first ground layer 52, the second trace layer 53, and the second ground layer 54 are bonded together with conductive glue or solder.

Figure 8:
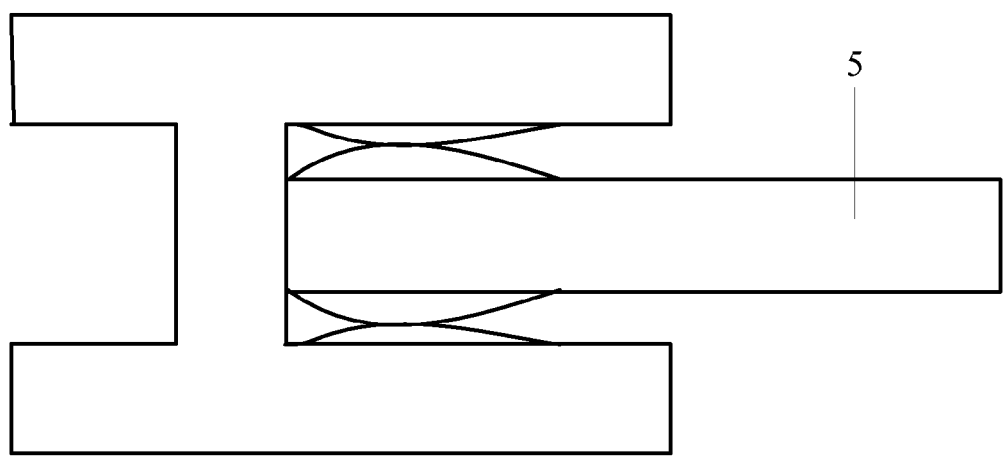
FIG. 8 is a side elevational view a flat flexible cable interconnected with a second printed circuit board.

Referring to FIG. 8, once those layers are bonded together, the timing controller 4 is encapsulated within the flat flexible cable 5. Once the first and second printed circuit boards 2 and 3 are interconnected with the flat flexible cable 5, the contact engaging portions and pin legs located on the mating interface and mounting interface of the connector 6, which are disposed on the first and second printed circuit boards 2 and 3, are interconnected with the fourth golden fingers 517 of the first and second trace layers 51. It is a double-sided interconnection.

In the above described embodiment, the timing controller 4 is encapsulated within the flat flexible cable 5. Apparently, other electronic components or devices from the first and second printed circuit boards can also be encapsulated within the flat flexible cable, for example, the IC chip can be integrated within the flat flexible cable 5. Accordingly, this alternative should also covered by the appended claims.

The present invention further includes a liquid crystal display device (not shown) in which the liquid crystal display module 1 is incorporated.

The present invention can be concluded with the following advantages. As compared to the prior arts, the timing controller is relocated out of the second printed circuit board of the liquid crystal display module and device, and properly integrated within the flat flexible cable. As a result, the over dimension of the second printed circuit board can be largely reduced. In addition, the front and rear faces of the timing controller is provided with an enlarged heat dissipating pad which benefits the heat dissipation efficiency of both the first and second ground layers. In addition, the front and rear faces of the laminated flat flexible cable is provided with the fourth golden fingers. Accordingly, the overall size of the flat flexible cable can be largely reduced with the same pin counts. Typically, it can reduce to a size of one half of original dimension.

In conclusion, the liquid crystal display module and device can incorporate with a second printed circuit board with reduced size, while the heat dissipating effect is increased, and the overall size of the flat flexible cable is reduced.

The description above is merely some preferable embodiments of the present invention, while is not intended to limit the implementation of the present invention. Any alternation and/or modifications based on the descriptions and drawings are to be construed as equivalent under the spirit of the present invention, and should be covered by the claims set forth below. On the other hand, even direct and indirect implementation of the present invention to other technology field, should still be covered by the claims as set forth below.

The invention claimed is:

1. A liquid crystal display module, comprising:
   a first printed circuit board, a second printed circuit board interconnected by a flat flexible cable, and a timing controller encapsulated within the flat flexible cable;
   the flexible flat cable including a first trace layer, a first ground layer, a second trace layer, and a second ground layer, a front face of the first trace layer being attached to a rear face of the first ground layer, a front face of the first ground layer being attached to a front face of the timing controller, a front face of the second ground layer being attached to a rear face of the timing controller, a rear face of the second ground layer being attached to a front face of the second trace layer; and
   the front face of the timing controller having an input interface, and an output interface embodied in golden fingers, a first power conductive pad, and a ground conductive pad, the input interface and the output interface being located at opposite ends of the front face of the timing controller, the first power conductive pad and the ground conductive pad being arranged on the other opposite ends of the front face of the timing controller.

2. The liquid crystal display module as recited in claim 1, wherein a first insulative layer is patched on both upper and rear faces of the first ground layer, the front face of the first ground layer defining an opening, and a first front conductive layer which is exposed and uncovered from the first insulative layer, the first ground layer further including a first rear conductive layer which is exposed and uncovered by the first insulative layer, the first rear conductive layer extending along a longitudinal side of the first ground layer to opposite ends.

3. The liquid crystal display module as recited in claim 1, wherein the timing controller further includes a heat dissipating pad on the front face of the timing controller, the heat dissipating pad extends toward the first power conductive pad and has a preset gap arranged therebetween.

4. The liquid crystal display module as recited in claim 1, wherein a first insulative layer is patched on both upper and rear faces of the first ground layer, the front face of the first ground layer defining an opening, and a first front conductive layer which is exposed and uncovered from the first insulative layer, the first ground layer further including a first rear conductive layer which is exposed and uncovered by the first insulative layer, the first rear conductive layer extending along a longitudinal side of the first ground layer to opposite ends.

5. The liquid crystal display module as recited in claim 4, wherein the first trace layer includes a second insulative layer covering both front and rear faces of a conductive layer, the front face of the first trace layer is defined with a second opening which penetrates the first trace layer, and a second front conductive layer which is exposed and uncovered by the second insulative layer, the first trace layer further includes a plurality of third golden fingers and second power conductive pad, the second front conductive layer extends to opposite ends along the front face of the first trace layer, third golden fingers are located between the second front conductive layer and the second power conductive pad, a gap between the input interface and output interface on the front face of the timing controller equals to the width and gap of the third golden fingers.

6. The liquid crystal display module as recited in claim 5, wherein a rear face of the first trace layer includes a plurality of fourth golden fingers which are located at opposite edges of the rear face of the first trace layer.

7. The liquid crystal display module as recited in claim 6, wherein the first and second trace layers have an identical configuration, and the first and second ground layers are identical, and the timing controller has an identical configuration on its upper and rear faces.

8. The liquid crystal display module as recited in claim 7, wherein the first printed circuit board and the second printed circuit board are each provided with an electrical connector and the first printed circuit board and the second printed circuit board are interconnected by the flat flexible cable terminated to the connectors, each connector featuring a mating interface having a contact engaging portion and a mounting interface having pin legs, the fourth golden fingers of the first and second trace layers are electrically interconnected with the connectors.

9. A liquid crystal display device, wherein the device includes a module as recited in claim 1.

10. The liquid crystal display module as recited in claim 9, wherein the flexible flat cable includes a first trace layer, a first ground layer, a second trace layer, and a second ground layer, a front face of the first trace layer being attached to a rear face of the first ground layer, a front face of the first ground layer being attached to a front face of the timing controller, a front face of the second ground layer being attached to a rear face of the timing controller, a rear face of the second ground layer being attached to a front face of the second trace layer.

11. The liquid crystal display module as recited in claim 10, wherein the front face of the timing controller includes an input, and an output interface embodied in golden fingers, a first power conductive pad, and a ground conductive pad, an input interface and output interface being located at opposite ends of the front face of the timing controller, the first power conductive pad and the ground conductive pad being arranged on other opposite ends of the front face of the timing controller.

* * * * *